(12) United States Patent
Yeh

(10) Patent No.: US 7,057,481 B2
(45) Date of Patent: Jun. 6, 2006

(54) PCB BASED BAND-PASS FILTER FOR CUTTING OUT HARMONIC HIGH FREQUENCY

(75) Inventor: Ming-Hau Yeh, Hsinchu (TW)

(73) Assignee: Alpha Networks Inc., Hsinchu (TW)

( * ) Notice: Subject to any disclaimer, the term of this patent is extended or adjusted under 35 U.S.C. 154(b) by 77 days.

(21) Appl. No.: 10/795,224

(22) Filed: Mar. 9, 2004

(65) Prior Publication Data

US 2005/0199419 A1    Sep. 15, 2005

(51) Int. Cl.
*H01P 1/203* (2006.01)
(52) U.S. Cl. ..................................... 333/204
(58) Field of Classification Search ................ 333/176, 333/204, 205, 219, 246
See application file for complete search history.

(56) References Cited

U.S. PATENT DOCUMENTS 3,345,589 A * 10/1967 Di Piazza ................... 333/204
3,662,294 A * 5/1972 Jacobs et al. ................. 333/33
4,288,766 A * 9/1981 Okita .......................... 333/204
4,489,292 A * 12/1984 Ogawa ....................... 333/202
4,999,596 A * 3/1991 Nakatani et al. ............ 333/204
6,104,259 A * 8/2000 Miyaura ...................... 333/176

* cited by examiner

*Primary Examiner*—Seungsook Ham
(74) *Attorney, Agent, or Firm*—Bacon & Thomas, PLLC

(57) ABSTRACT

The present invention is to provide a PCB based band-pass filter for cutting out harmonic of high frequency wherein in manufacturing a circuit board of a wireless communication product technology of PCB production is utilized to mount an input microstrip line, an output microstrip line, an open circuit microstrip line, and a short circuit microstrip line of the band-pass filter on the circuit board. By utilizing the present invention, it is possible of utilizing an unoccupied area of the circuit board to mount a band-pass filter thereon without using an additional filter of high frequency. Moreover, the band-pass filter is adapted to cut out harmonic of two, three, or four times of a fundamental frequency caused by nonlinear distortion of a power amplifier of the wireless communication product.

9 Claims, 4 Drawing Sheets

PCB BASED BAND-PASS FILTER FOR CUTTING OUT HARMONIC HIGH FREQUENCY

FIELD OF THE INVENTION

The present invention relates to band-pass filters and more particularly to a PCB (printed circuit board) based band-pass filter for cutting out harmonic of high frequency (e.g., harmonic of two, three, or four times of a fundamental frequency).

BACKGROUND OF THE INVENTION

In recent years there has been a significant growth in WLAN (wireless local network) due to the ever increasing demand of wireless communication products. Such growth is particularly obvious after the promulgation of IEEE 802.11 WLAN protocol in 1997. IEEE 802.11 WLAN protocol not only provides many novel features to the current wireless communications but also provides a solution of enabling two wireless communication products manufactured by different companies to communicate each other. As such, the promulgation of IEEE 802.11 WLAN protocol is a milestone of the development of WLAN. Moreover, IEEE 802.11 WLAN protocol ensures that core device is the only solution of implementing a single chip. Thus, it can significantly reduce the cost of adopting wireless technology so as to enable WLAN to be widely employed in various wireless communication products.

Conventionally, electromagnetic waves are susceptible of generation when a wireless communication product is transferring data in high power. And in turn, EMI (electromagnetic interference) may be caused by the electromagnetic waves. For solving problems associated therewith, many rules are promulgated by advanced countries. These rules impose a limitation on the import and use of wireless communication products found not complying therewith. In view of the above, the developers and manufacturers of wireless communication products have to take related rules into consideration in developing the control circuitry of the wireless communication product. Typically, a filter is provided after a power amplifier so as to cut out the generated harmonic spuriousness of high frequency. In such a manner, the produced wireless communication products are able to comply with the related rules. Conventionally, filters used in the production of the control circuitry of the wireless communication product are filters of high frequency made of ceramic material. The advantages of such filters of high frequency are that they can cut out harmonic of two or three times of a fundamental frequency and are much compact. The disadvantages thereof are expensive, requiring an additional installation procedure, cumbersome process, and much increased manufacturing cost. As an end, the production is low.

For solving the above problems, some manufacturers in the art use waveguide elements to simulate the desired filter circuit which is in turn employed to form a microstrip circuit 10 as illustrated in FIG. 1. Also, technology of PCB production is utilized in manufacturing circuit boards of wireless communication products in which the microstrip circuit 10 is formed on the circuit board. It is desired that the above configuration can effectively cut out harmonic spuriousness of at least two times of a fundamental frequency caused by nonlinear distortion of the power amplifier of the wireless communication product by means of the microstrip circuit 10 without using an additional filter of high frequency. However, the miniaturization of microstrip circuit contradicts the cut out range of harmonic spuriousness. As such, for achieving the purpose of cutting out a wider range of harmonic spuriousness (i.e., having a frequency of a larger number of times of a fundamental frequency) the produced microstrip circuit may be too large and complicated. As an end, it undesirably greatly limits applications of microstrip circuit, significantly increases the manufacturing difficulties, and compromises the goal of miniaturizing the circuit board and its product.

Harmonic of signals transmitted in high power is the most possible one that will not pass an EMI test conducted on a wireless communication product. This is particularly true for a signal having a harmonic of two, three, or four times of a fundamental frequency. Such is not acceptable.

Thus, it is desirable among developers and manufacturers of the art to provide wireless communication products complying with the related rules without greatly increasing the manufacturing cost and the size.

SUMMARY OF THE INVENTION

An object of the present invention is to provide a PCB based band-pass filter for cutting out harmonic of high frequency wherein in manufacturing a circuit board of a wireless communication product technology of PCB production is utilized to mount an input microstrip line, an output microstrip line, an open circuit microstrip line, and a short circuit microstrip line of the band-pass filter on the circuit board. By utilizing the present invention, it is possible of utilizing an unoccupied area of the circuit board to mount a band-pass filter thereon without using an additional filter of high frequency. Moreover, the band-pass filter is adapted to cut out harmonic of two, three, or four times of a fundamental frequency caused by nonlinear distortion of a power amplifier of the wireless communication product. Additionally, the above drawbacks of the prior art associated with cutting out harmonic of at least two times of the fundamental frequency in developing wireless communication products can be eliminated.

In one aspect of the present invention, the input microstrip line and the output microstrip line are coupled together to form a first straight line, the open circuit microstrip line and the short circuit microstrip line are coupled together to form a second straight line cross and perpendicular to the first straight line, and the short circuit microstrip line is coupled to ground as a short circuit. As a result, a required band-pass filter can be formed on the circuit board by a simple microstrip circuit for greatly reducing the manufacturing cost of the wireless communication products.

In another aspect of the present invention, length of the short circuit microstrip line is about one fourth of wavelength of a fundamental frequency, length of the open circuit microstrip line is about one fourth of the wavelength of three times of the fundamental frequency, the short circuit microstrip lines are adapted to modify to be bent or curve slightly so as to reduce the area of the microstrip circuit without adversely affecting the function of the band-pass filter, and the smaller microstrip circuit is adapted to mount on a limited unoccupied area on the circuit board for greatly decreasing the area of the circuit board.

The above and other objects, features and advantages of the present invention will become apparent from the following detailed description taken with the accompanying drawings.

DETAILED DESCRIPTION OF THE PREFERRED EMBODIMENTS

Principles of a first preferred embodiment of the invention will be described in details below with respect to a wireless communication product complying with IEEE 802.11b WLAN protocol.

Figure 1:
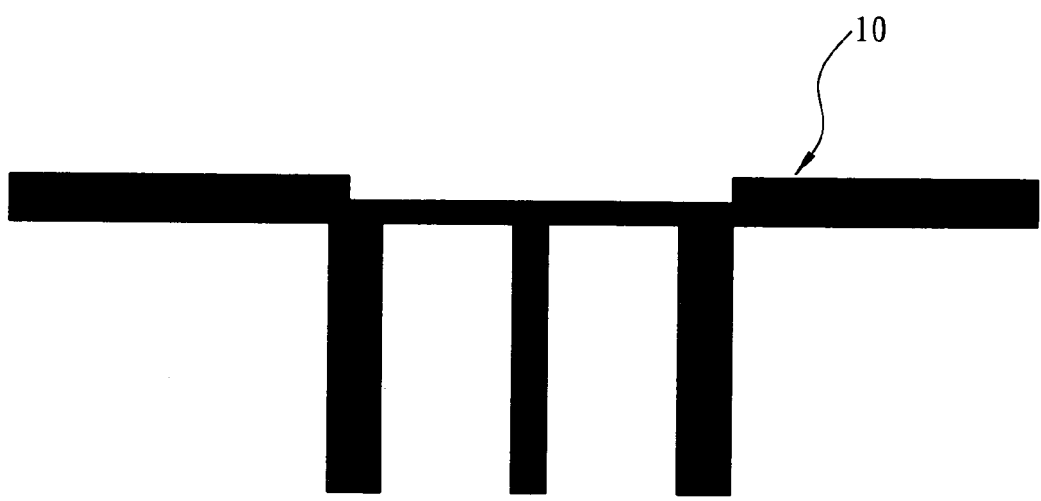
FIG. 1 is a plan view of a conventional microstrip circuit mounted on a band-pass filter.
Figure 2:
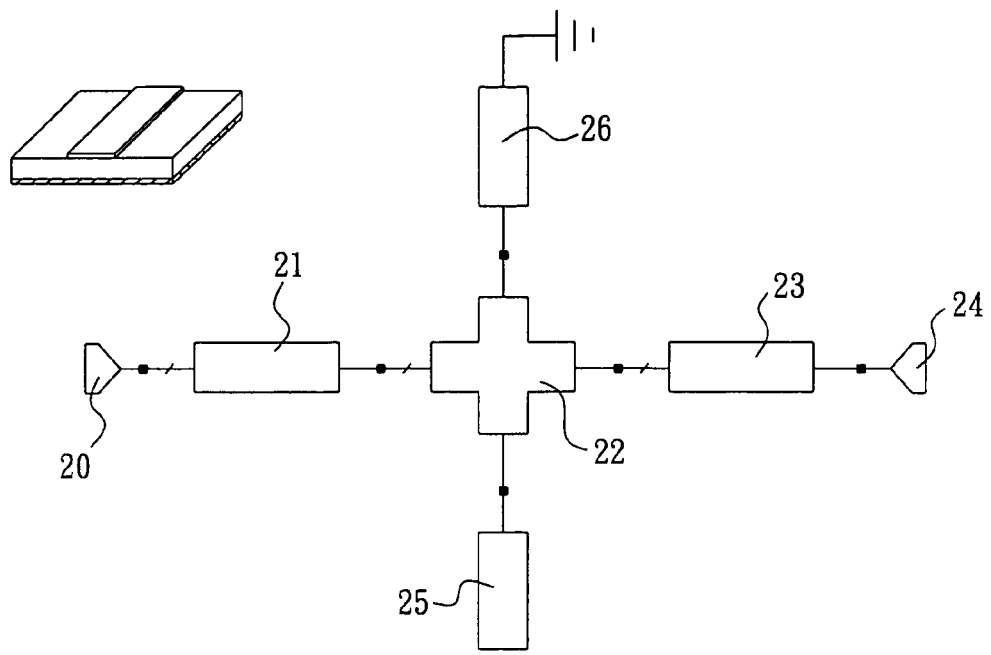
FIG. 2 schematically depicts a first preferred embodiment of band-pass filter according to the invention simulated by waveguide elements.

The fundamental frequency of a signal transmitted by the wireless communication product is at the range of 2.4 GHz to 2.5 GHz. Referring to FIG. 2, waveguide elements are used to simulate a band-pass filter in a design phase according to the invention. In the configuration of the band-pass filter, there are provided a first microstrip line 21, a second microstrip line 23, an open circuit third microstrip line 25, and a short circuit fourth microstrip line 26. One end of the first microstrip line 21 is coupled to an input port 20 to form an input of the band-pass filter and the other end thereof is coupled to a microstrip cross component 22. The microstrip cross component 22 is in turn coupled to one end of the second microstrip line 23. Note that the first microstrip line 21 and the second microstrip line 23 are coupled to opposite ends of the microstrip cross component 22 to form a straight line. The other end of the second microstrip line 23 is coupled to an output port 24 to form an output of the band-pass filter. The other two ends of the microstrip cross component 22 are coupled to the third microstrip line 25 and the fourth microstrip line 26 respectively so as to form another straight line. The other end of the third microstrip line 25 is open so as to form an open circuit microstrip line of the invention. The other end of the fourth microstrip line 26 is coupled to ground (i.e., short circuit) so as to from a short circuit microstrip line of the invention.

In the simulated configuration, the line impedance of each of the microstrip lines is 50 ohm and the line width is 18 mil. Length of each of the first microstrip line 21 and the second microstrip line 23 is 100 mil. Length of the open circuit third microstrip line 25 is 223.94 mil. Length of the short circuit fourth microstrip line 26 is 652.1 mil. The simulation signal transmitted by the wireless communication product in high power is fed to the input port 20 of the band-pass filter. Next, a frequency response graph is plotted by measuring a frequency of the signal at the output port 24. It is obvious that the invention can cut out harmonic of two, three, or four times of a fundamental frequency.

Figure 3:
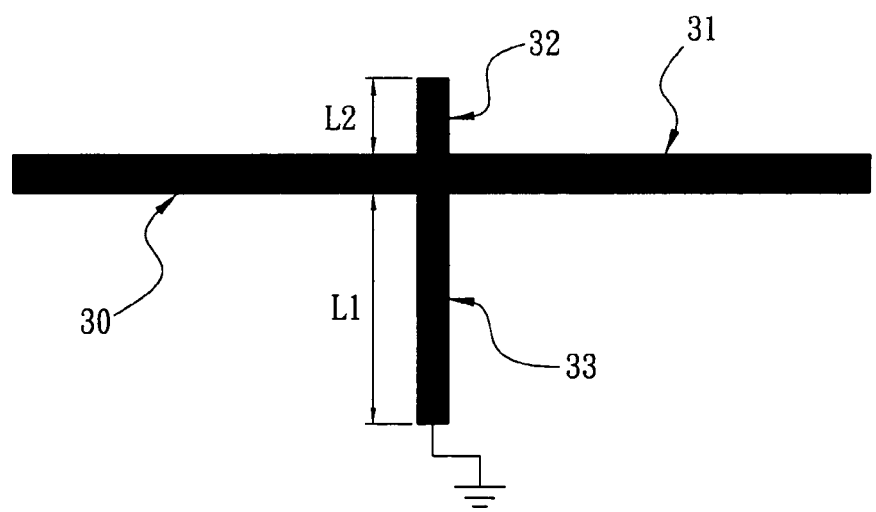
FIG. 3 is a plan view of the band-pass filter shown in FIG. 2.

Hence, the inventor develops a microstrip circuit by incorporating the simulated configuration of FIG. 2 in manufacturing the circuit boards of wireless communication products. Also, technology of PCB production is utilized so as to mount the microstrip circuit on a surface of the circuit board of the wireless communication product as illustrated in FIG. 3. As shown, the microstrip circuit comprises an input microstrip line 30, an output microstrip line 31, an open circuit microstrip line 32, and a short circuit microstrip line 33. The input microstrip line 30 and the output microstrip line 31 are coupled together to form a first straight line. The open circuit microstrip line 32 and the short circuit microstrip line 33 are coupled together to form a second straight line cross and perpendicular to the first straight line. The short circuit microstrip line 33 is coupled to ground (i.e., short circuit). In the embodiment, length L1 of the short circuit microstrip line 33 is about one fourth of the wavelength of a fundamental frequency (i.e., about 16 mm). This can implement a simple band-pass filter having a frequency range of 2.4 GHz to 2.5 GHz. Also, harmonic of two or four times of the fundamental frequency (e.g., 50 GHz or 10 GHz) can be prevented from passing (i.e., band rejection filtering). That is, at least harmonic of two or four times of the fundamental frequency can be cut out. Further, length L2 of the open circuit microstrip line 32 is about one fourth of the wavelength of three times of the fundamental frequency (i.e., about 6 mm). This can implement a simple band rejection filter. Also, harmonic of three times of the fundamental frequency (e.g., 7.5 GHz) can be prevented from passing (i.e., band rejection filtering). Moreover, the frequency range cut out by the short circuit microstrip line 33 will not affect adversely the open circuit microstrip line 32 since the short circuit microstrip line 33 is open circuit with respect to the frequency range. Hence, at least harmonic of three times of the fundamental frequency can be cut out. As an end, a band-pass filter capable of cutting out harmonic of two, three, or four times of the fundamental frequency can be produced on the circuit board of the wireless communication product.

Figure 4:
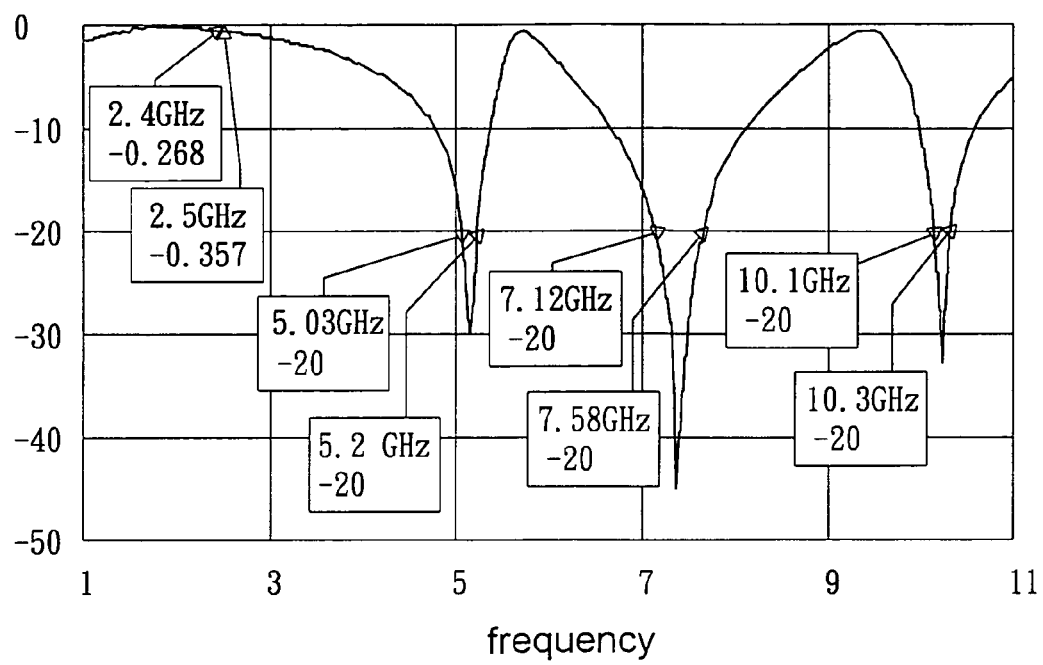
FIG. 4 is a frequency response graph by plotting dB versus frequency for the band-pass filter shown in FIG. 3 mounted in a wireless communication product being measured after filtering frequency.

The signal transmitted by the wireless communication product in high power is fed to the input of the input microstrip line 30. Next, a frequency response graph is plotted as shown in FIG. 4. It is seen from the frequency response graph that an insertion loss is 0.268 dB at a frequency of 2.4 GHz, an insertion loss is 0.357 dB at a frequency of 2.5 GHz, a cut out amount of harmonic (e.g., 5.03 GHz or 5.2 GHz) of two times of the fundamental frequency is 20 dB, a cut out amount of harmonic (e.g., 7.12 GHz or 7.58 GHz) of three times of the fundamental frequency is 20 dB, and a cut out amount of harmonic (e.g., 10.1 GHz or 10.3 GHz) of four times of the fundamental frequency is 20 dB. In view of the above, it is found that the band-pass filter of the invention can not only cut out harmonic of two times of the fundamental frequency but also cut out harmonic of three or four times of the fundamental frequency.

Figure 5:
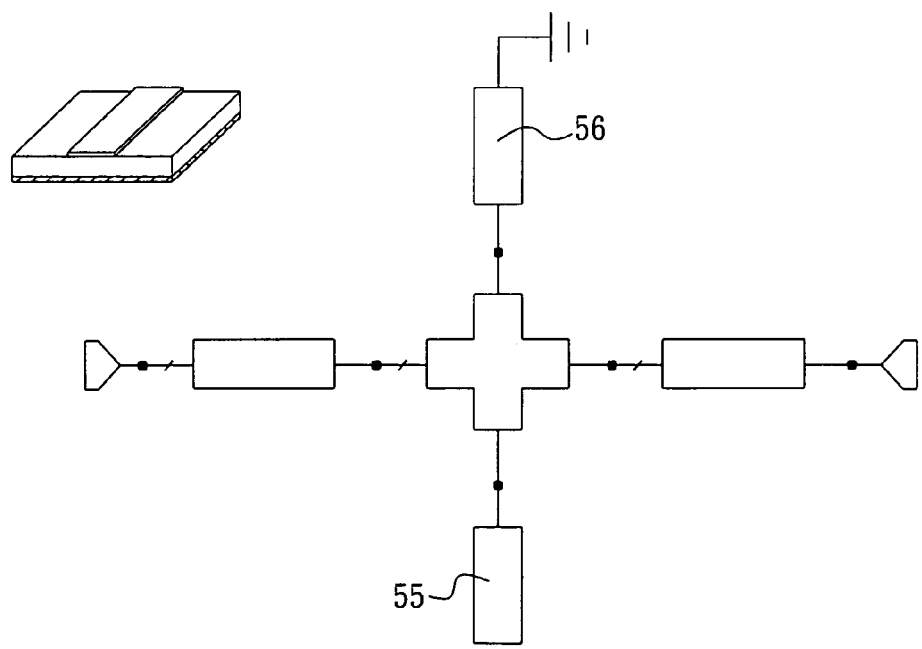
FIG. 5 schematically depicts a second preferred embodiment of band-pass filter according to the invention simulated by waveguide elements.

Referring to FIG. 5, there is shown a second preferred embodiment of the invention in which waveguide elements are used to simulate a band-pass filter having a wider band rejection width in a design phase. The widths and lengths of a third microstrip line 55 and a fourth microstrip line 56 are changed in order to simulate various band-pass filters. It is found from an experiment that if the fourth microstrip line

Figure 6:
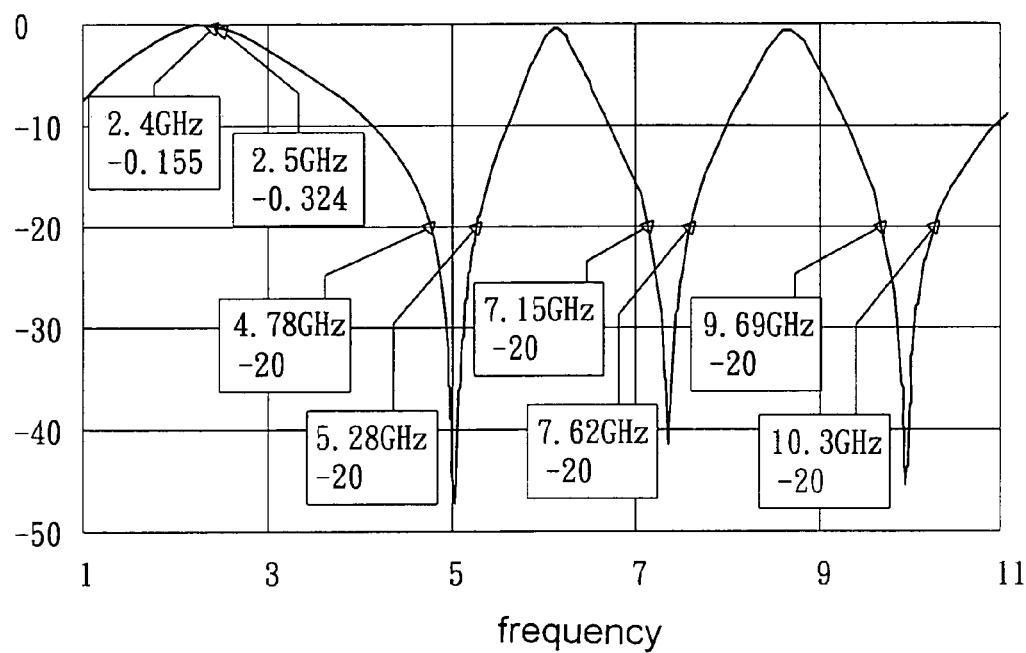
FIG. 6 is a frequency response graph by plotting dB versus frequency for a microstrip line formed of the band-pass filter shown in FIG. 5 mounted in a wireless communication product being measured after filtering frequency.

56 having a width of 652.1 mil (see FIG. 2) is decreased to 605 mil (see FIG. 5) the produced band-pass filter has a wider band rejection width under the same conditions. Also, technology of PCB production is utilized so as to mount the microstrip circuit on a surface of the circuit board of the wireless communication product as illustrated in FIG. 5. The signal transmitted by the wireless communication product in high power is then fed to the input of the band-pass filter. Next, a frequency response graph is plotted at FIG. 6 by measuring a frequency of the signal at the output. It is seen from the frequency response graph that an insertion loss is 0.155 dB at a frequency of 2.4 GHz, an insertion loss is 0.324 dB at a frequency of 2.5 GHz, a cut out amount of harmonic (e.g., 4.78 GHz or 5.28 GHz) of two times of the fundamental frequency is 20 dB, a cut out amount of harmonic (e.g., 7.15 GHz or 7.62 GHz) of three times of the fundamental frequency is 20 dB, and a cut out amount of harmonic (e.g., 9.69 GHz or 10.3 GHz) of four times of the fundamental frequency is 20 dB. In view of the above, it is found that the band rejection width at a frequency of about 5 GHz or about 10 GHz of the second embodiment is wider than that of the first embodiment.

Figure 7:
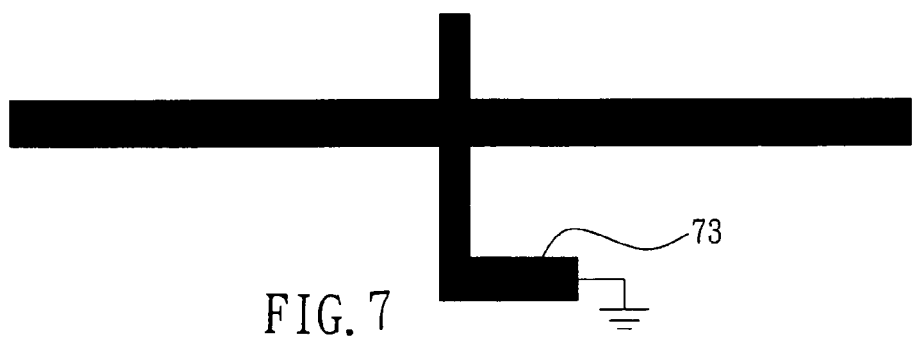
FIG. 7 is a plan view of the microstrip circuit of a band-pass filter according to a third preferred embodiment of the invention.
Figure 8:
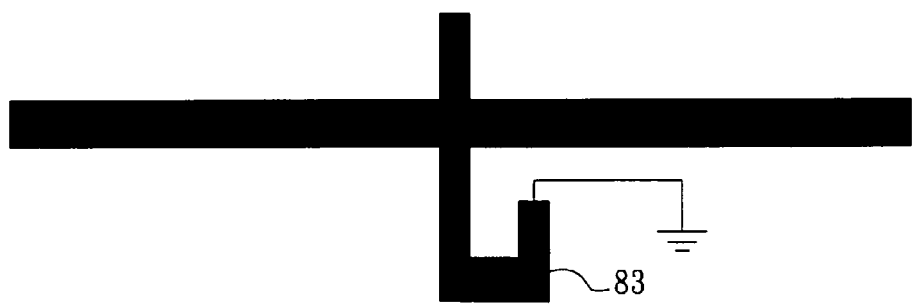
FIG. 8 is a plan view of the microstrip circuit of a band-pass filter according to a fourth preferred embodiment of the invention.

Moreover, Referring to FIG. 3 again, length of the short circuit microstrip line 33 of the band-pass filter is much longer than that of the open circuit microstrip line 32 in the invention. Referring to FIGS. 7 and 8, for preventing the produced circuit board from being too large due to large microstrip circuit, short circuit microstrip lines 73 and 83 have to be bent or curve slightly so as to reduce the area of the microstrip circuit without adversely affecting the function of the band-pass filter. The smaller microstrip circuit is then adapted to mount on a limited unoccupied area on a circuit board of a wireless communication product. As an end, the area of the circuit board is much reduced.

While the invention has been described by means of specific embodiments, numerous modifications and variations could be made thereto by those skilled in the art without departing from the scope and spirit of the invention set forth in the claims.

What is claimed is:

1. A PCB based band-pass filter for cutting out harmonic of high frequency, comprising a circuit board of a wireless communication product on which is mounted an input microstrip line, an output microstrip line, an open circuit microstrip line, and a short circuit microstrip line of the band-pass filter on the circuit board, wherein the input microstrip line and the output microstrip line are coupled together to form a first straight line, the open circuit microstrip line and the short circuit microstrip line are coupled together to form a second straight line cross and perpendicular to the first straight line, and the short circuit microstrip line is coupled to ground as a short circuit, and wherein the band-pass filter not only cuts out a harmonic of two times a fundamental frequency, but also harmonics of three or four times the fundamental frequency.

2. The band-pass filter of claim 1, wherein length of the short circuit microstrip line is about one fourth of wavelength of a fundamental frequency.

3. The band-pass filter of claim 2, wherein length of the open circuit microstrip line is about one fourth of the wavelength of three times of the fundamental frequency.

4. The band-pass filter of claim 1, wherein the short circuit microstrip line is bent and has a length longer than that of the open circuit microstrip line.

5. The band-pass filter of claim 4, wherein length of the short circuit microstrip line is about one fourth of wavelength of a fundamental frequency.

6. The band-pass filter of claim 5, wherein length of the open circuit microstrip line is about one fourth of the wavelength of three times of the fundamental frequency.

7. The band-pass filter of claim 1, wherein the short circuit microstrip line is curve and has a length longer than that of the open circuit microstrip line.

8. The band-pass filter of claim 7, wherein length of the short circuit microstrip line is about one fourth of wavelength of a fundamental frequency.

9. The band-pass filter of claim 8, wherein length of the open circuit microstrip line is about one fourth of the wavelength of three times of the fundamental frequency.

* * * * *